United States Patent
Donoso et al.

(10) Patent No.: US 6,517,130 B1
(45) Date of Patent: Feb. 11, 2003

(54) SELF POSITIONING VACUUM CHUCK

(75) Inventors: Bernardo Donoso, San Jose, CA (US); Joseph J. Stevens, San Jose, CA (US); Donald J. Olgado, Palo Alto, CA (US); Mark Denome, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/524,977

(22) Filed: Mar. 14, 2000

(51) Int. Cl.$^7$ .............................. B66C 1/02; B25J 15/06
(52) U.S. Cl. ..................... 294/64.1; 294/64.3; 414/737; 414/941; 901/40
(58) Field of Search ............................... 294/64.1, 64.2, 294/64.3, 65; 414/737, 752, 941; 901/39, 40

(56) References Cited

U.S. PATENT DOCUMENTS

| | | | | |
|---|---|---|---|---|
| 2,680,994 A | * | 6/1954 | Wood | 269/21 |
| 3,517,958 A | * | 6/1970 | Boucher et al. | 294/64.1 |
| 3,602,543 A | * | 8/1971 | Sjodin | 294/64.1 |
| 4,557,514 A | * | 12/1985 | Cushman et al. | 901/40 |
| 4,600,229 A | * | 7/1986 | Oten | 294/64.1 |
| 4,680,061 A | | 7/1987 | Lamont, Jr. et al. | 250/398 |
| 4,773,687 A | * | 9/1988 | Bush et al. | 294/64.1 |
| 4,917,427 A | * | 4/1990 | Scaglia | 294/64.1 |
| 5,169,196 A | * | 12/1992 | Safabakhsh | 294/64.3 |
| 5,195,862 A | * | 3/1993 | Cruz | 414/941 |
| 5,207,465 A | * | 5/1993 | Rich | 294/64.1 |
| 5,547,415 A | | 8/1996 | Hasegawa et al. | 451/44 |
| 5,765,889 A | * | 6/1998 | Nam et al. | 414/941 |
| 5,879,040 A | * | 3/1999 | Nagai et al. | 294/64.1 |
| 5,937,993 A | * | 8/1999 | Sheets et al. | 414/941 |
| 5,967,578 A | * | 10/1999 | Frey | 901/40 |

FOREIGN PATENT DOCUMENTS

| | | | | |
|---|---|---|---|---|
| DE | 1506502 | * | 7/1969 | 294/64.1 |
| DE | 1180510 | * | 2/1970 | 294/64.1 |
| DE | 1598795 | * | 9/1981 | 294/64.1 |
| JP | 405047899 | * | 2/1993 | 414/941 |
| JP | 405084682 | * | 4/1993 | 294/64.1 |
| SU | 001249768 | * | 6/1991 | 294/64.3 |
| SU | 01771958 | * | 10/1992 | 294/64.1 |

* cited by examiner

Primary Examiner—Christopher P. Ellis
Assistant Examiner—Paul T. Chin
(74) Attorney, Agent, or Firm—Moser, Patterson & Sheridan, LLP

(57) ABSTRACT

In one aspect, a vacuum chuck supports a substrate on an end effector, the vacuum chuck comprising a position reference structure and a suction cup. The position reference structure is mounted to the surface and comprises a reference surface. The suction cup is located proximate the reference surface and comprising a suction mount. In another aspect, a method of chucking a substrate to a vacuum chuck is provided. The vacuum chuck comprises a suction cup and a position reference structure. The method comprises attaching the suction cup to the substrate to form a seal therebetween. The suction cup is deformed such that the substrate contacts the position reference structure. The substrate is then leveled on the position reference structure.

10 Claims, 7 Drawing Sheets

SELF POSITIONING VACUUM CHUCK

BACKGROUND OF THE INVENTION

1. Field of the Invention

The present invention relates to an apparatus and method for handling substrates in a processing system and more particularly to a vacuum chuck mounted on an end effector.

2. Background of the Related Art

The advantages of using automated substrate handling devices, or robots, in the fabrication of integrated circuits to transfer substrates, including silicon substrates, throughout a cluster tool are well established. Such cluster tools typically comprise a plurality of process chambers and at least one factory interface all connected by a transfer chamber. The cluster tool processes substrates sequentially during automatic processing of substrates. Cassettes positioned in the factory interfaces will hold one, or a plurality of substrates. One or more robots in the transfer chamber sequentially remove substrates from the cassettes and transfer the substrate to one of the process chambers in the cluster tool.

The substrates can then be processed using a variety of processes including physical vapor deposition (PVD), chemical vapor deposition (CVD), electroplating, metal layering, or etching. Some electroplating processes present challenges for robot transfer since substrates are typically processed in a face-down position. Electroplating in integrated circuit design was previously limited to the fabrication of lines on circuit boards. Electroplating is now used to fill vias and contact points in sub-quarter micron, multi-level metallization designs.

Robots typically comprise a hub about which the robot rotates, an end effector (commonly called a "blade"), and a plurality of hinged robot links that provide for relative translation of the end effector relative to the robot hub. Traditional end effectors, disposed at a distal end of a robot arm, are positioned underneath a substrate to support the substrate. The end effector may contain some type of chuck (for example vacuum or electrostatic) to hold the substrate to the end effector. During manufacture of IC's, the "face" portion of the substrate is processed such as with implantation to create devices, and with interconnect structures used to connect the devices. Therefore, the "front" side of the wafer must be maintained as clean as possible, with minimal contact between this from surface and process equipment. The back surface of the wafer, on which relatively little processing occurs, is thus used for substrate storage and transfer.

Cluster tools dealing with such modem processing techniques as electroplating require both face-up and face-down handling of substrates. In such cases, the robot "flips" substrates between a face-up position and a face-down position between certain successive processing steps. Flipping substrates with end effectors in which a vacuum chuck securely holds the substrate is desirable, but is difficult to perform. Also, ensuring that the substrate is held in a secured, aligned position relative to the end effector is desirable so that the robot can transfer the substrate without collisions with other known objects and equipment. Transferring substrates in a secure and aligned position increases throughput by reducing the need to align the substrate in a process chamber and decreases the possibility of dropping and damaging the expensive substrates.

With certain processing equipment, the robot transports a substrate in a face-down position. A vacuum chuck is typically secured as part of an end effector to allow and accelerate wafer flipping and face-down operations. The vacuum chuck uses vacuum suction applied to a vacuum line with one or more holes formed at one end of the end effector to provide vacuum chucking. After the robot inserts a substrate into an appropriate position in the electroplating process chamber in the face-down position, the substrate separates from the vacuum chuck. The robot then removes the end effector from the process chamber after which the chamber is closed and electroplating occurs. Once the substrate completes electroplating, the robot inserts the end effector into the electroplating process chamber above the substrate. The robot moves into an appropriate position and vacuum chucks the substrate to the end effector. The vacuum chucking process in the inverted orientation is called an inverted hand-off. The substrate is then removed from the chamber. The end effector then flips the wafer into a face-up position for further processing. When the robot transfers substrates in a face-up position, the end effector is located underneath the substrate. Gravity helps ensure flush contact between the end effector and a substrate when the substrate is in the face-up position.

One problem encountered in transferring face-down substrates is that it is difficult to align the vacuum chuck of the end effector accurately with the substrate. This difficulty in alignment makes vacuum chucking more complex. Various factors contribute to inaccurate alignment, including inexact calibration of the robot and process chamber misalignments or expansion. Accurate alignment is important in an inverted handoff to provide a good vacuum seal between the end effector and the substrate for reliable vacuum chucking. Inaccurate alignment during inverted hand-offs may result in failed hand-offs, damaged substrates and chambers, and reduced throughput.

Another problem with transporting substrates is that the substrate may be skewed relative to the end effector when picked up by the end effector. If the substrate is correctly aligned with respect to the end effector, then the position of the entire substrate can be determined and used by the robot. If, however, the substrate is skewed relative to the end effector, then the position of the substrate is uncertain during further substrate transporting and processing. Certainty of the substrate position is important for the controller of the robot to ensure precise robot movements and transfers of the substrate and thereby avoid colliding the wafer with the process equipment or mis-positioning the substrate in the equipment. Such collisions often result in the substrate chipping or breaking, and resultant contamination within or damage of the process chamber. Misalignments of the substrate with the end effector following inverted handoffs also increase the probability that the robot will drop the substrate during transfer or further processing.

Therefore, there is a need for a robot that can reliably secure a substrate to the end effector in a manner that ensures proper alignment during inverted operation or flipping of the substrate.

SUMMARY OF THE INVENTION

In one aspect, a vacuum chuck supports a substrate on an end effector, the vacuum chuck comprising a position reference structure and a suction cup. The position reference structure is mounted to the surface and comprises a reference surface. The suction cup is located proximate the reference surface and comprising a suction mount. In another aspect, a method of chucking a substrate to a vacuum chuck is provided. The vacuum chuck comprises a suction cup and a position reference structure. The method comprises attaching the suction cup to the substrate to form a seal therebetween. The suction cup is deformed such that the substrate contacts the position reference structure. The substrate is then leveled on the position reference structure.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE PREFERRED EMBODIMENT

The present invention generally provides a robot end effector including a vacuum chuck, and systems and methods for its use. The vacuum chuck is configured for handling substrates in a processing system that provides accurate alignment between an end effector and a substrate. This alignment is highly repeatable between successive substrates. Initially, a cluster tool 10 that performs electroplating is described as one application of robot that uses an end effector having a vacuum chuck. The structure of multiple embodiments of end effectors is then detailed. Finally, the operation of the end effector is described.

I. Electroplating Processes and Equipment

Figure 1:
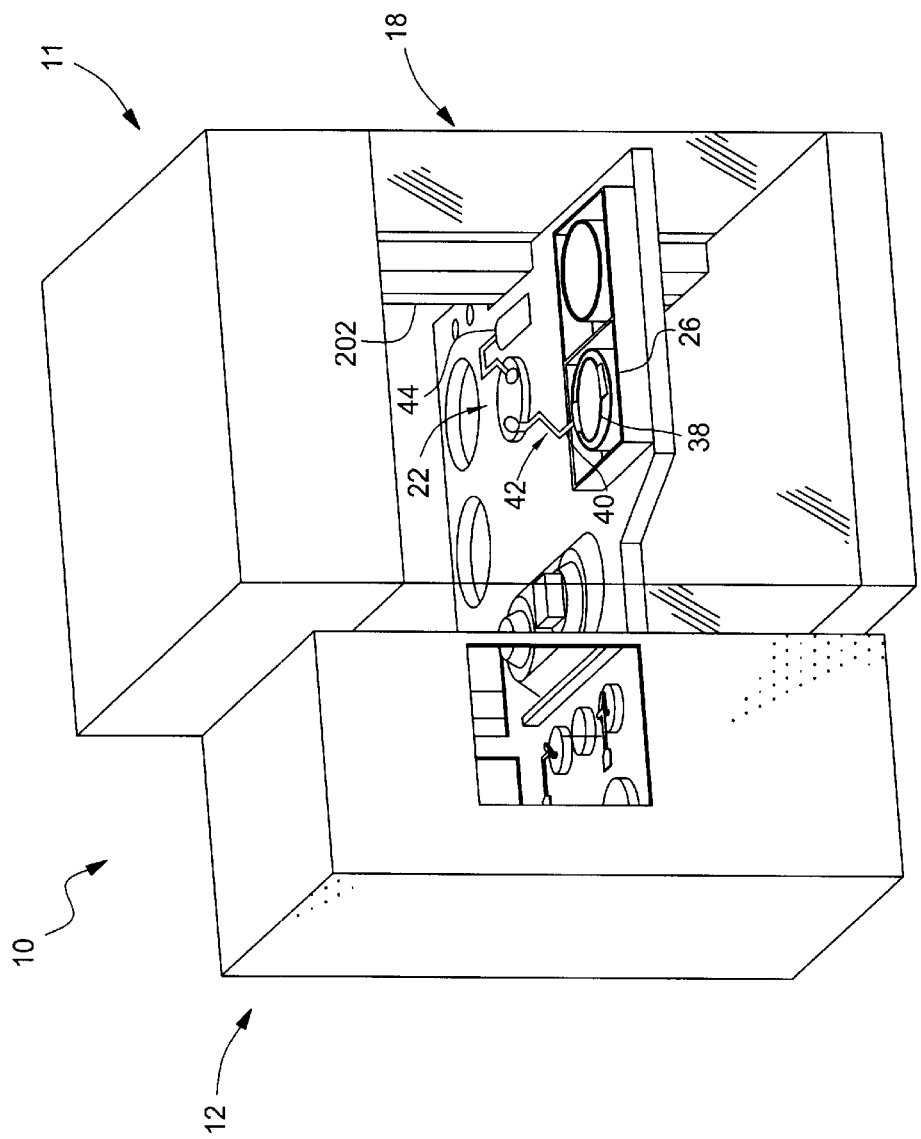
FIG. 1 is a perspective view of one embodiment of electroplating system.

FIG. 1 is a perspective view of a cluster tool 10 (shown in top plan view in FIG. 2) that performs a variety of sequential processes such as electroplating. The cluster tool 10 is a representative system. The actual cluster tool 10 may include an electroplating chamber, a physical vapor deposition (PVD) chamber, a chemical vapor deposition (CVD) chamber, or any known process chamber or combination thereof.

Figure 2:
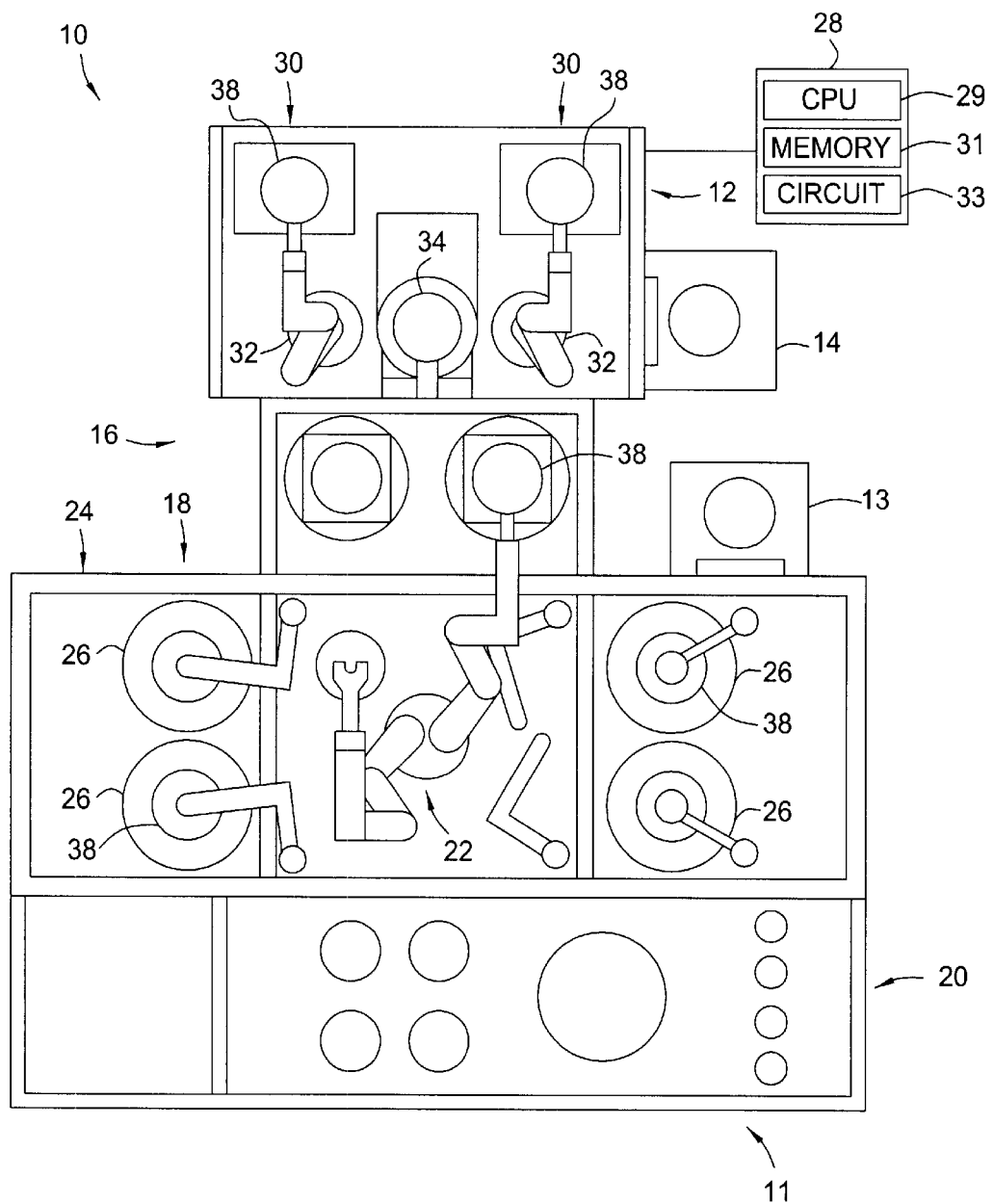
FIG. 2 is a top plan view of the internal components of the electroplating system shown in FIG. 1.

The cluster tool 10 generally comprises an electroplating segment 11, a factory interface 12, a thermal anneal chamber 14, and a mainframe 18. As shown in FIG. 2, the factory interface 12 includes one or more cassettes 30, one or more factory interface transfer robots 32, and at least one substrate orienter 34. A clean environment partially enclosed by clear panels 27 encloses the electroplating system. The mainframe 18 generally comprises a spin-rinse-dry (SRD) station 16, a mainframe transfer robot 22, an electrolyte replenishing system 20, a plurality of plating stations 24, and controller 28. Each plating station 24 includes one or more plating cells 26. The electrolyte replenishing system 20 refreshes the electrolyte used in the plating stations 24 to ensure the chemistry is maintained. The mainframe transfer robot 22 transfers substrates between different components (for example plating cells 26 and SRD station 16) within the mainframe 18, and orients the substrate 38 into a position where it can be accepted by the different components.

Figure 3:
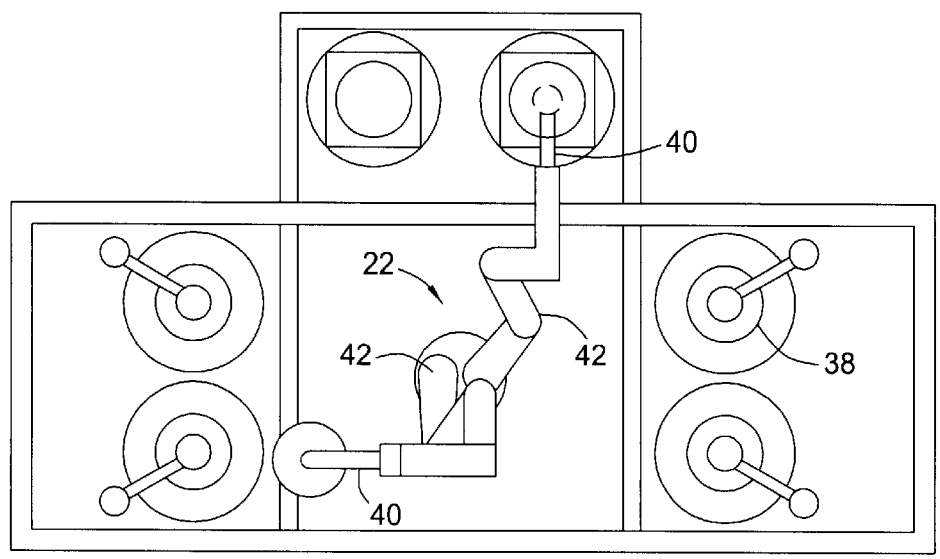
FIG. 3 is a top view of a portion of the FIG. 2 system emphasizing one embodiment of a robot system.

FIG. 3 is an enlarged plan view of an embodiment of a transfer robot 22 used within a cluster tool 10. The mainframe transfer robot 22 is capable of both linear and rotational (i.e., orbit of the end effector about a pivot point) motions. The mainframe transfer robot 22 comprises a robot linkage including a plurality of robot arms 42 that comprise an inversion mechanism 40. An end effector 44 capable of supporting a substrate is disposed at the distal end of each robot arm 42. The mainframe transfer robot 22 includes a robot arm 42 comprising an inversion mechanism 40. The inversion mechanism (comprising a servo motor or stepper motor to be controlled by controller 28) inverts or flips the end effector 44 and the substrates 38 supported thereon between a face-up position and a face-down position. Substrates 38 are then further processed in the SRD station 16, the thermal anneal chamber 14, the process chamber 13, and ultimately placed back into the cassettes 30 for storage or removal. The transfer robot 22 is a representative embodiment, and it is envisioned that the term robot comprises any robot having an end effector, robot blade, or other element that supports a vacuum chuck.

The mainframe transfer robot 22 chucks, transport, releases, and flips the substrate 38 in both the face-up and face-down positions, at the direction of a controller. The controller 28 typically comprises programmable central processing unit (CPU) 29, a memory 31, support circuits 33, and a bus (not shown). The controller 28 can be a microprocessor, a general purpose computer, or any other known type of computer. The controller 28 controls the overall operation of the cluster tool as well as the robot motions of the mainframe transfer robot 22 and the factory interface transfer robot 32.

The vacuum chuck is particularly useful in cluster tools 10 comprising a plurality of process chambers, in which certain substrates are processed in a face-down position. In a face-down position, the end effector is positioned above a substrate with the vacuum chuck connected to the upwardly facing back surface of the substrate, with the face or "front" side of the substrate to be processed facing downward. In a face-up position, the end effector is positioned below the substrate with the vacuum chuck secured to the bottom surface of the substrate, and the face of the substrate to be processed facing upward. Examples of face-down process chambers include certain electroplaters in which metal (such as copper) is layered on the bottom of the substrates. Examples of face-up chambers include physical vapor deposition (PVD) and chemical vapor deposition (CVD) in which processing occurs on the top surface of the substrate. The vacuum chuck described below is useful where substrates are picked up in a face-down position (also called an inverted hand-off). In addition, the vacuum chuck is useful where substrates are "flipped" between a face-up position and a face-down position or carried in a face-down position. This vacuum chuck is applicable to metal deposition systems that typically operate under approximately atmospheric pressures. However, the pressures applied to the vacuum chuck can be slightly modified to permit operation of the vacuum chuck at different pressures.

II. Vacuum Chuck Embodiments

Multiple embodiments of vacuum chucks are now described. Any of the following embodiments of vacuum chuck may accomplish flipping of a substrate, an inverted hand-off, and carrying a substrate in both the face-up and face-down substrate positions.

Figure 4:
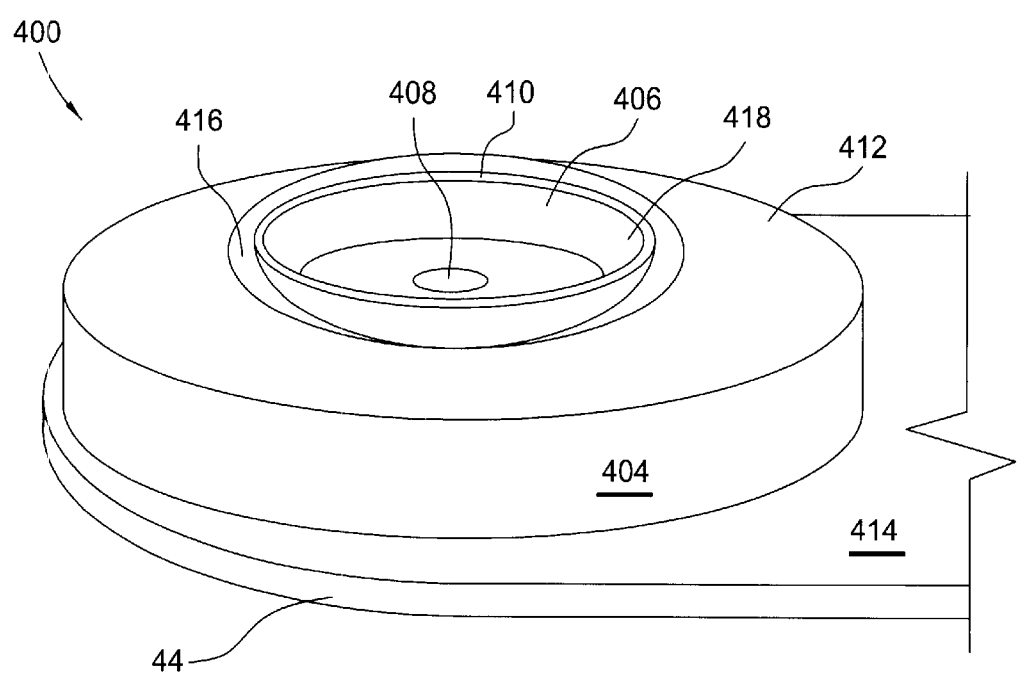
FIG. 4 is a perspective view of one embodiment of the vacuum chuck.
Figure 5:
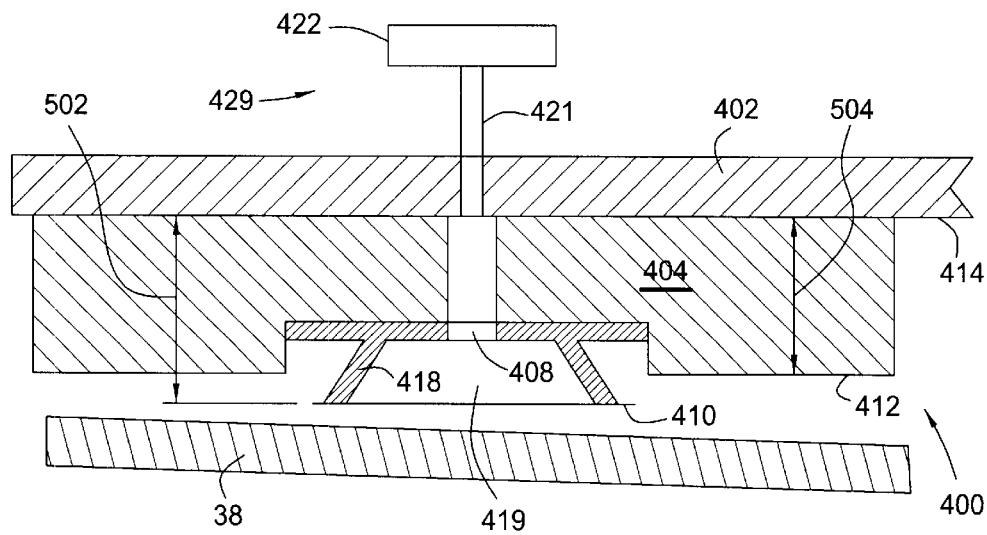
FIG. 5 is a side cross-sectional view of the vacuum chuck in FIG. 4 in an inverted position and misaligned relative to a substrate.
Figure 6:
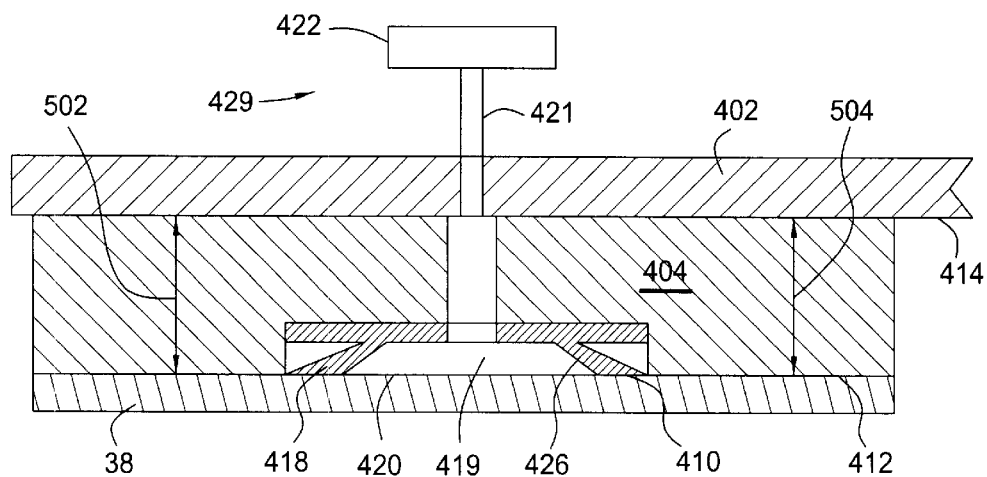
FIG. 6 is the vacuum chuck in FIG. 5 after the vacuum chuck is coupled to a substrate.
Figure 8:
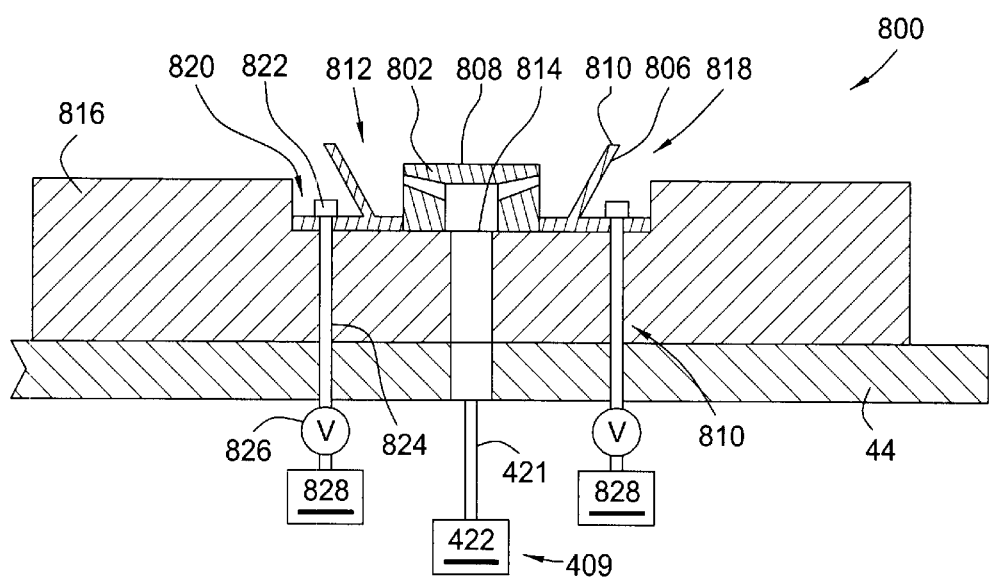
FIG. 8 is a side cross sectional view of an alternate embodiment of the vacuum chuck from the embodiment shown in FIG. 5.
Figure 9:
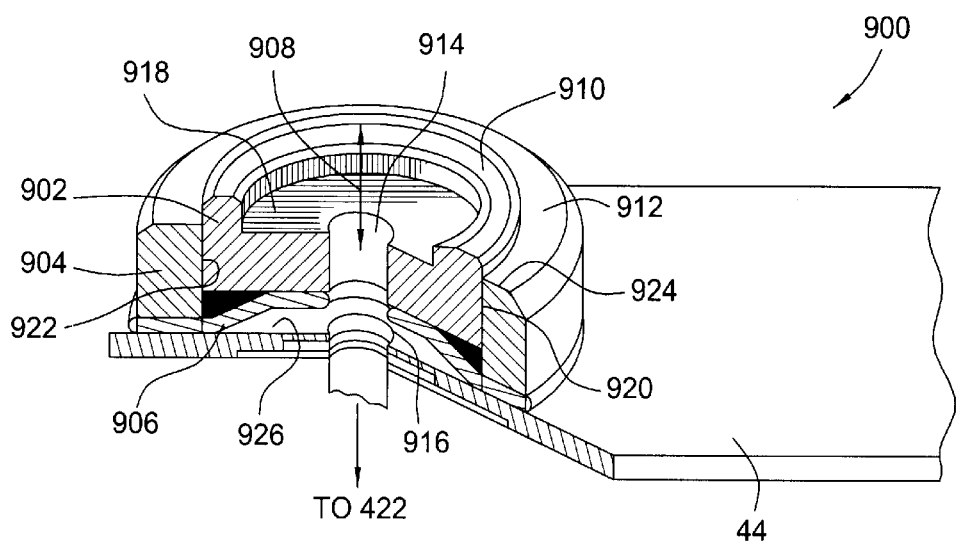
FIG. 9 is a perspective view of an alternate embodiment of a flexible suction cup assembly from that shown in FIG. 7.

One embodiment of vacuum chuck 400 is depicted in FIGS. 4–6. Another embodiment of vacuum chuck 800 is depicted in FIG. 8. Another embodiment of vacuum chuck 900 is depicted in FIG. 9. Yet another embodiment of vacuum chuck 1000 is depicted in FIGS. 10–13. While these embodiments are illustrative, they are not intended to limit the scope of vacuum chuck set forth in the claims.

In each vacuum chuck embodiment, the vacuum chuck comprises a suction cup member and positioning member. The positioning member has a positioning edge used by the vacuum chuck in aligning the substrate with the end effector 44. The positioning edge acts as a reference surface that makes it possible for the robot to support a substrate in a position that is aligned in a known position with respect to the robot. Such alignment is highly repeatable. Additionally, in each embodiment of the vacuum chuck, a vacuum is generated between substrate 38 and the end effector 44 that maintains a vacuum suction on the backside of the substrate, which is sufficient to hold and support substrate 38.

A. Embodiment depicted in FIGS. 4–6

FIGS. 4, 5, and 6 are respectively perspective, side cross sectional, and side cross sectional views of one embodiment of vacuum chuck 400. The vacuum chuck 400 comprises a position reference structure 404, a flexible suction cup 406, a vacuum port 408, and a controllable vacuum device 409. The position reference structure 404 has a reference surface 412 formed thereon. The flexible suction cup 406 has a suction cup surface or seal 410 formed thereon. The vacuum chuck 400 is affixed to a surface 414 of the end effector 44. In FIG. 5, the vacuum chuck 400 is inverted, similar to as it would appear when approaching substrate 38 to enter a process tool. FIG. 6 shows the vacuum chuck as it appears when engaged with a substrate (such as when inserting substrate 38 into an electroplating chamber where inverted substrate processing occurs).

The term "rigid" and "flexible" are used in this disclosure as a relative term, and are not meant to imply that the respective element is completely rigid or completely flexible. For example, certain hard rubber or plastic elements may provide sufficient structural rigidity to be considered rigid. Other relatively softer elements may provide sufficient structural resilience to be considered flexible.

The compliancy of the seal enhances its sealing capability, and permits the vacuum chuck to pick up a substrate even if the substrate is not aligned parallel with the chucking surface of the end effector, or where the substrate has contamination or slight discontinuities thereon. With respect to copper plating, it is known that crystals of copper and other contaminants conform on the substrate (sometimes as thick as $\frac{1}{16}^{th}$ inch thick) making vacuum chucking difficult. Materials of the suction cup and coatings applied to the suction cup preferably allow operation under corrosive and other types of hazardous chemical environments without undue erosion or degradation of the suction cup. The seal extends about the periphery of the suction cup surface 410 and is configured to be deformable. Thus if the backside of a wafer being picked up by the suction cup has a slight irregularity, the seal may deform slightly from its circular-planar outline to conform to the outline of the irregularity. When vacuum is applied within the seal, the suction cup surface further conforms to the shape of the backside of the wafer.

Figure 7:
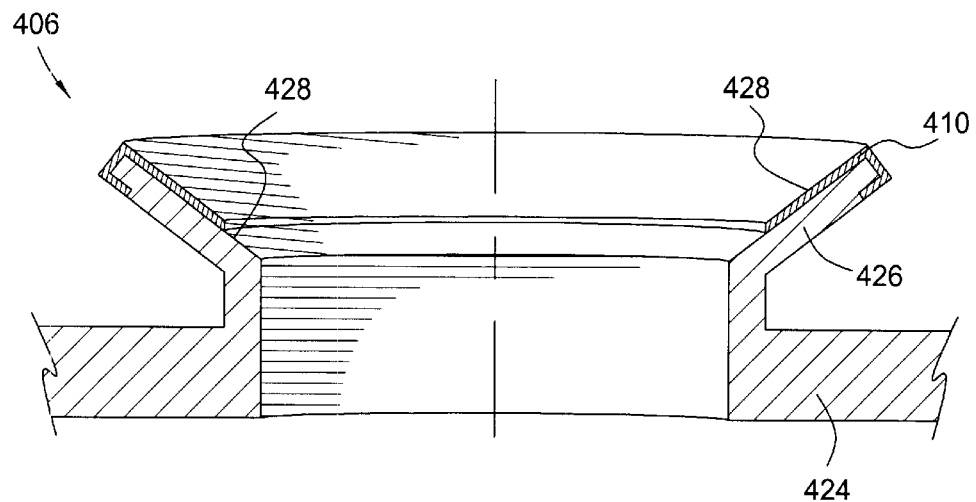
FIG. 7 is a cross sectional view of the flexible suction cup of the embodiment shown in FIG. 5.

The flexible suction cup 406, when contacted with the backside of a substrate, forms and maintains a vacuum in the volume between the seal and the substrate 38. A vacuum port 408 extends through both the bottom of the flexible suction cup 406 and the position reference structure 404. The vacuum port 408 is in communication via line 421 (built into the end effector) to a vacuum pump 422. In one example, the flexible suction cup 406 is approximately an inch in diameter. The necessary pressure to be applied to the suction cup 406 to support the substrate depends upon the size of the substrate and the configuration of the suction cup 406 and position reference structure 404 i.e., a greater diameter cup will require less vacuum where a larger substrate will require more vacuum. The flexible suction cup 406 comprises a base portion 424 and a cup portion 426 shown in detail in FIG. 7. The cup portion 426 includes a suction mount surface 410. The suction cup is formed of such an elastomeric material as Buna-N, VITON™, EPDM, silicone rubber, CHEMRAZ® (CHEMRAZ is a trademark owned by Green, Tweed, & Co.), KALRAZ® (KALRAZ is a trademark owned by Green, Tweed, & Co.), or TEFLON® (TEFLON is a trademark owned by E. I. duPont Nemoirs and Company) impregnated rubber. Alternately, the suction cup is formed from a thin compliant metallic material, which may also be coated, in particular where it contacts the substrate, with a more compliant material.

The flexible suction cup 406 may include a coating 428 such as TEFLON® formed on the interior surface, around the suction mount surface 410, and/or possibly even around the outside of the flexible suction cup 406. The TEFLON™ may be applied in different thicknesses depending upon the desired suction cup characteristics. TEFLON® is highly lubrous and enhances the sliding action of the flexible suction cup 406. Portions of the flexible suction cup 406 coated with TEFLON® such as the suction mount surface 410 may slide along a substrate surface 420 when a seal is being formed between the suction cup and the substrate surface, i.e., as the substrate 38 and reference surface are brought together, the surface 410 may expand in circumference as it is pushed toward the recess in the reference surface within which the cup resides.

The coating on the flexible suction cup 406 limits mechanical resistance between the suction cup 406 and the substrate surface 420. Debris or other contaminants and irregularities on the backside of the substrate often make it difficult to vacuum chuck against substrate surface 420, where the contaminants limits the substrate from adhering with a firm contact to the substrate surrounding the vacuum source or port. The above sliding action assists in forming an adequate seal between the substrate surface 420 and the suction cup 406.

The flexible suction cup may include a chemically resistant coating such as PFA or TEFLON thereon that allows the end-effector to perform in a chemically aggressive environment without undue corrosion or erosion thereof. The coating 428 is also believed to limit the degradation of the suction cup 406 when exposed to harsh chemicals that may exist on substrate 38. Consequently, the coating extends the expected lifetime of the flexible suction cup 406.

The coating is also believed to regulate the characteristics of the flexible suction cup 406 depending upon the coating's thickness. For example, a flexible suction cup 406 having a thicker coating may be used with substrates expected to have a thick crystalline layer on the backside, such that the coating would be able to displace more of the crystals and minimize suction cup leaks. Coating of the flexible suction cup 406 may limit its sticking. By comparison, a flexible suction cup 406 having a thinner coating may be used with substrates that are free of a thick crystalline formation or harsh chemicals, such that a more flexible suction cup 406 may provide an improved seal.

The position reference structure 404 has a reference surface 412 and a recess 416 formed therein. The position reference structure 404 is formed from material such as hard elastomerics and metals. The base portion 424 of the flexible suction cup 406 mounts to a wall of recess 416 formed in the position reference structure 404. The position reference structure 404 is used as a repeatable attitude reference for locating a substrate relative to a vacuum chuck. Robots can precisely position a vacuum chuck relative to a substrate that is maintained at a known three-dimensional location. Known orienter devices are used to locate substrates at a desired three-dimensional position such that a robot can easily attach a vacuum chuck to the backside of a substrate as desired. When the flexible suction cup attaches to a desired and known location on the backside of the substrate, the attitude and the position of the substrate is known relative to the vacuum chuck are known. Thus, any substrate abutting the position reference structure 404 is substantially aligned to the surface 414 of the end effector 44. The controller 28 shown in FIG. 2 can readily determine the position of the outline of a substrate based upon its relation to the end effector because each substrate is held in a repeatable position by the vacuum chuck 400.

FIG. 5 shows a vacuum chuck approaching a substrate 38. The suction mount surface 410 of the flexible suction cup 406 is spaced from the surface 414 of the end effector 44 by a first distance shown by the arrow 502. The reference surface 412 of the position reference structure 404 is spaced from the surface 414 by a second distance shown by he arrow 504. The first distance is greater than the second distance. Thus, the suction mount surface 410 contacts a substrate 38 before the reference surface 412 contacts the substrate. Due to the flexibility of the flexible suction cup 406, as the suction cup 406 engages with substrate, a larger percentage of the suction mount surface 410 will contact the substrate until the entire circumference of surface 410 contacts the substrate.

As the vacuum chuck 400 progresses downward against the substrate backside surface, the entire periphery of the suction mount surface 410 will contact substrate 38 due to the compliancy of the flexible suction cup 406. In this position, the vacuum pump 422 creates a vacuum between the interior surface 418 of the suction cup 406 and the substrate 38. The seal is improved by the pressure difference created by the vacuum pump 422 that pumps out the internal space 419. The flexible suction cup adapts its form to the substrate surface creating the seal necessary to maintain a vacuum in the volume between the wafer and the seal even if the end effector 44 and the substrate surface are not parallel.

Once the vacuum seal is formed, the vacuum created between a substrate 38 and the flexible suction cup 406 deforms the suction cup. This deformation "pulls" the substrate upward (i.e., against reference surface 412) until the substrate abuts with the reference surface 412. Since reference surface 412 is aligned with the end effector 44, having the substrate 38 abut the reference surface 412 results in the substrate 38 positioning (or aligning) with the end effector 44. Generation of a vacuum in the interior space 419 acts to bias the substrate 38 against the reference surface 412.

Substrate 38 is considered parallel or aligned to the surface 414 of the end effector 44 when its surface abuts with the reference surface 412. Though the face of the end effector 44 may be selected such that the substrate surface is not exactly parallel to the face, the term "parallel" within this specification indicates that the substrate is aligned with the end effector in a known, repeatable manner. Thus, the controller 28 that controls operation of the robot can determine or compensate for some calibrated location of a substrate relative to the end effector 44.

The vacuum chuck 400 provides for a highly repeatable positioning arrangement, in which each successive substrate 38 that is vacuum chucked has a back surface which is aligned with the end effector 44. This feature of repeatability applies to the latter embodiments described below as well. Such repeatability is important where further processing follows the vacuum chucking.

B. Embodiment depicted in FIG. 8

FIG. 8 shows a side cross-sectional view of another embodiment of vacuum chuck 800. The vacuum chuck 800 is attached to the end effector 44. The vacuum chuck 800 comprises a position reference structure 802, a flexible suction cup 806, a vacuum port 814, and an air shield 820. The position reference structure 802 includes a reference surface 808. The flexible suction cup 806 includes a suction mount surface 810. The vacuum chuck 800 comprises a flexible suction cup 806 including a suction mount surface 810 and a position reference structure 802 having a reference surface 808. The flexible suction cup 806 extends around and outwardly of the plane of the reference surface 808. Additionally, the reference surface 808 preferably extends outwardly of and above the plane defined by the surrounding face 816, but may be on the same plane. This configuration permits a substrate 38 to abut the reference surface 808 before is abuts the surrounding face 816.

Thus, in the embodiment shown in FIG. 8, as the end effector is positioned to engage a substrate, the contact is initially made between the suction mount surface 810 and the substrate, before the reference surface 808 contacts substrate. The suction cup thus initially deforms on contact with a substrate 38 as a seal is created between the substrate and the flexible suction cup 806 and a vacuum is created in the resulting volume formed. However, when a substrate is coupled to the vacuum chuck 800, substrate 38 is positioned in a repeatable position vis-a-vis the robot components against the reference surface 808. The reference surface 808 contacting the substrate provides a high degree of positioning repeatability, in which a substrate is aligned relative to the end effector 44 each time that the vacuum chuck couples to a substrate. The reference surface 808 is within an enclosure 812 defined between a substrate and the suction cup 806 (when the substrate is in position on the end effector). To provide a pumping aperture, the vacuum port 814 opens to the side of the position reference structure 802 and into the volume formed by the flexible suction cup and the substrate. Thus, fluid communication with the enclosure 812 is maintained regardless of whether a substrate abuts the reference surface 808.

The vacuum chuck 800 also may comprise an air shield 820 that directs air into the recess 818 circumferentially formed between the surrounding face 816 and the flexible suction cup 806. The air shield 820 comprises air nozzles 822, tubing 824, controllable valve 826, and air source 828. An air source 828 directs air selectively (under the control of controllable valve 826) via the tubing 824 to the air nozzles 822. The air nozzle 822 projects air at a sufficient velocity to drive off or dry liquids disposed on substrate 38 adjacent the vacuum chuck 800. In various processes, when a substrate is vertically orientated (as they are being flipped between the face-up position and a face-down position) liquid about the periphery of the substrate sometimes runs into the center of the substrate to a position where it is desired to attach or detach the vacuum chuck. A wet substrate chucked by the vacuum chuck 800 can increase surface tension between the flexible suction cup 806 and substrate 38, and may increase the force required to dechuck substrate 38. The air chuck acts as a shield to limit passage of liquid (either by diversion or evaporation) along the surface of the substrate to where it is desired to vacuum chuck the substrate. As the vacuum chuck 800 is moved to chuck the water, the air shield 820 can be used to blow off liquids and other impurities from the surface of the wafer. Thus, there is a reduced possibility of damaged or broken chucks (which can also damage the processing equipment) when using the air shield 820. The air shield 820 may be easily adopted with the other embodiments of the invention described herein.

C. Embodiment depicted in FIG. 9

FIG. 9 illustrates a perspective view of yet another embodiment of vacuum chuck 900 attached to the end effector 44. The vacuum chuck 900 comprises sliding sealing suction cup 902, a positioning chuck 904, and a flexible biasing element 906. The sliding sealing suction cup 902 includes a suction mount surface 910 that is capable of forming a seal with a substrate. The positioning chuck 904 comprises a generally planar reference surface 912. The sliding sealing suction cup 902 has a generally cylindrical outer surface 920, and the positioning chuck 904 has a generally cylindrical inner surface 922. The cylindrical outer surface 920 can slide relative to the cylindrical inner surface 922 to provide motion between the sliding sealing suction cup 902 and the positioning chuck 904 in a direction indicated by arrow 908. The flexible biasing element 906 preferably comprises a canted spring that biases the sliding sealing suction cup 902 upwardly. The suction mount surface 910 extends above the reference surface 912 (the directions are as indicated in FIG. 9). An upper vacuum chamber 914 is defined within the sliding sealing suction cup 902. A lower vacuum chamber 916 is defined between the edge effector 44 and a lower surface of the sliding sealing suction cup 902, and within the reference surface 912 of the positioning chuck 904. Upper vacuum chamber 914 and lower vacuum chamber 916 combine to connect a vacuum pump to an enclosure 918 formed between the sliding sealing suction cup 902 and substrate.

The clearance between the sliding sealing suction cup 902 and the positioning chuck 904 (between relative cylindrical surfaces 920 and 922), in combination with the flat annular surface of cup 902, enables establishing of a seal when the plane of the substrate 38 is not parallel to the vacuum chuck 900. This making of this seal is enhanced by the radial clearance between the inner peripheral surface 922 (of the rigid reference chuck 904) and the outer peripheral surface 920 (of the sliding sealing suction cup 902) permits "tipping" of the sliding sealing suction cup 902 relative to the rigid reference chuck i.e. the axis of the cylindrical section of the positioning member can be set as set forth in the positioning member 904. This tipping permits the suction mount surface 910 to align with a substrate 38 that is slightly skewed or misaligned during the establishing of a seal between the substrate and the reference surface. The flexible biasing element 906 biases the sliding sealing suction cup 902 in a vertical upward direction. A compliant sealed volume is formed between the sliding seal suction cup 902 and the internal face 926. The compliant sealed volume allows for a creation of a vacuum in the vacuum chamber 910 by vacuum pump 422. The creation of the vacuum biases the suction mount surface 918 against the substrate. The flexible biasing element 906 is preferably formed from a hard elastomeric material that can be deformed slightly to form a seal against a substrate when the biasing element 906 biases the sliding sealing suction cup 902 against the substrate. This seal can be formed even when the sliding seal suction cup 902 is skewed relative to the substrate.

Thus, when the vacuum chuck 900 shown in FIG. 9 initially chucks a substrate, a first point of the suction mount surface 910 of the sliding sealing suction cup 902 contacts the substrate except in the case where the substrate plane and the plane of the mount surface 910 are parallel. As the substrate and the end effector move closer together, the suction mount surface 910 cants into alignment with the plane of the substrate 38, thus permitting the entire suction mount surface 910 to contact substrate 38. The vacuum device 422 then creates a vacuum in the enclosure 918 defined between the substrate aligned with the sliding sealing suction cup 902 and an internal face 926 of the end effector 44 by pumping air there between. This vacuum is sufficient to displace the substrate 38 and the sliding sealing suction cup 902 toward the end effector 44, against the upward bias of the flexible biasing element 906. This sliding continues until the substrate 38 abuts with the reference surface 912, thereby positioning the substrate relative to the vacuum chuck 900. Based upon this positioning, the controller 28 that controls the operation of the transfer robot 22 including the vacuum chuck 900 can be assured of the horizontal position of a substrate that is vacuum chucked during transfer and processing. Furthermore, inverted handoffs and flipping of substrates are secure.

D. Embodiment depicted in FIGS. 10–13

Figure 10:
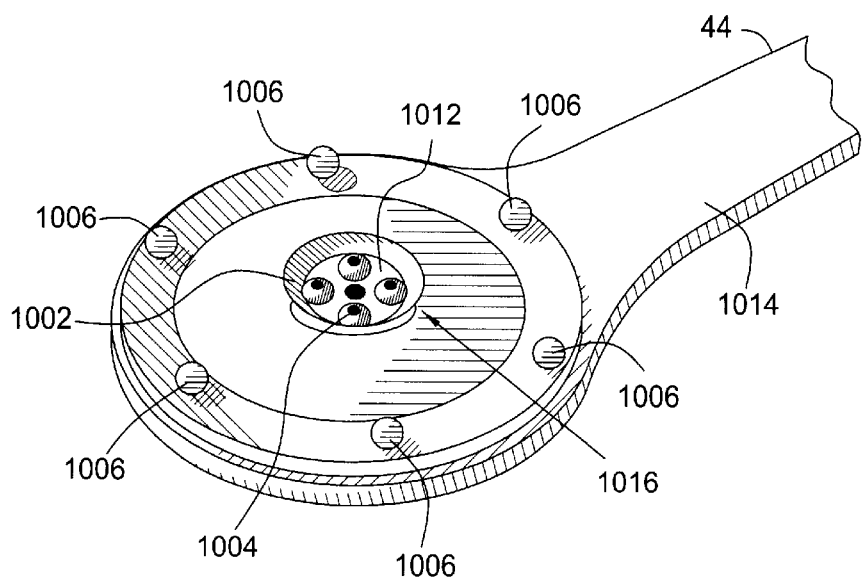
FIG. 10 is a perspective view of a final embodiment of a vacuum chuck.
Figure 12:
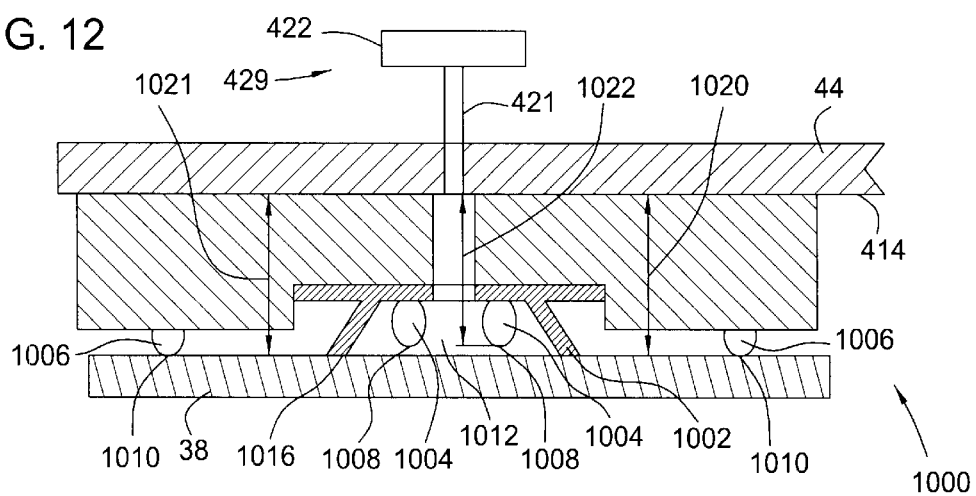
FIG. 12 is a side cross sectional view of one version of the FIG. 10 embodiment in which the vacuum chuck is chucked to a substrate.
Figure 13:
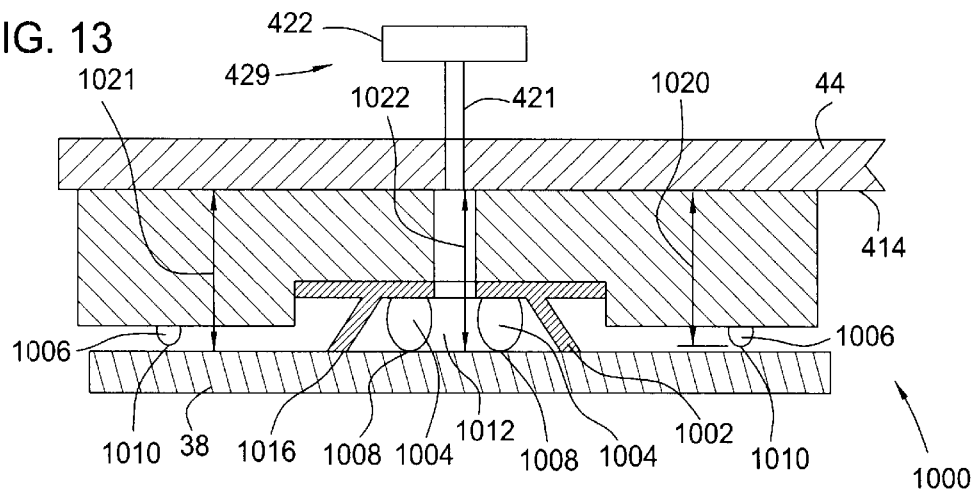
FIG. 13 is a side cross sectional view of another version of the FIG. 10 embodiment in which the vacuum chuck is chucked to a substrate.

FIG. 10 shows a perspective view of another embodiment of vacuum chuck 1000. Vacuum chuck 1000 comprises a flexible suction cup 1002, a plurality of inner positioning mounts 1004, and a plurality of outer positioning mounts 1006. The inner positioning mounts 1004 comprise an inner reference surface 1008 and spaces 1012 between each one of the inner reference surface 1008. The outer positioning mounts 1006 comprise outer reference surface 1010. FIGS. 12 and 13 show a cross sectional view of two modifications of the FIG. 10 embodiment in which the vacuum chuck 1000 is chucked to a substrate in a face-down position. In FIG. 12, the inner reference surface 1008 is closer to the end effector 44 than the outer reference surface 1010. In FIG. 13, the inner reference surface 1008 is further from the end effector 44 than the outer reference surface 1010.

Figure 11:
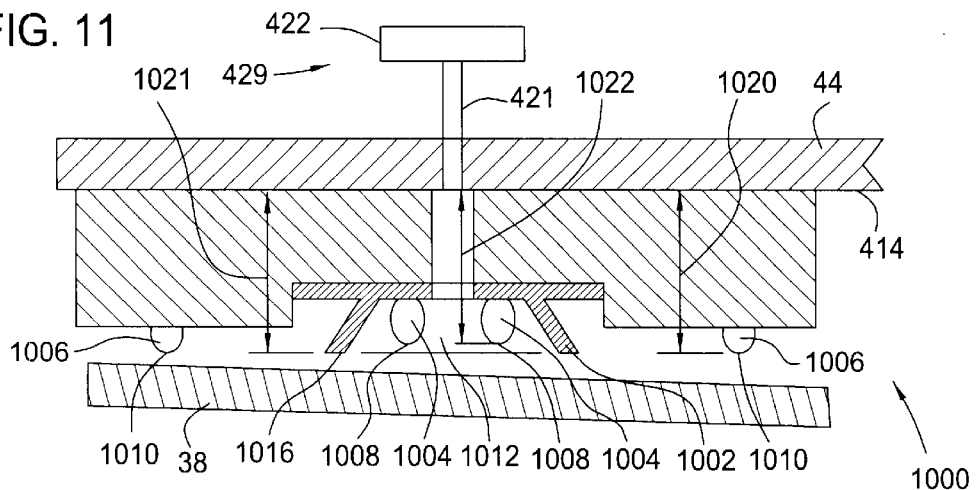
FIG. 11 is a side cross sectional view of the FIG. 10 vacuum chuck in an inverted position positioned above a misaligned substrate.

FIG. 11 shows the FIG. 10 embodiment in a cross sectional view. Both the outer reference surface 1010 and the inner reference surface 1008 are spaced from a face 414 of the end effector 44 by respective distances shown as 1020 and 1022. Both distances 1020 and 1022 are smaller than a distance shown as 1021 between suction mount surface 1016 of the flexible suction cup 1002 and face 414. Therefore, the flexible suction cup 1002 typically contacts a misaligned substrate 38 prior to contact of the substrate with the outer reference surface 1010 or the inner reference surface 1008. The vacuum pump 422 will generate a vacuum within the flexible suction cup 1002 and the substrate by evacuating air therefrom. The vacuum will deform the flexible suction cup 1002, thereby bringing the substrate 38 closer to the end effector 44. The substrate 38 will level against either the outer reference surface as depicted in FIG. 11, or the inner reference surface as depicted in FIG. 12 depending upon which is located closer to the substrate, as will be discussed further herein. Alternatively, the distance 1020 can be selected to equal the distance shown as 1022 such the substrate 38 will level against both the inner reference surface or the outer reference surface simultaneously.

If the inner reference surface 1008 is closer to the end effector 44 than the outer reference surface 1010 as shown in FIG. 12, then substrate 38 will level against the outer reference surface. As the flexible suction cup 1002 deforms during the positioning process, the distance 1021 shown in FIG. 11 will decrease until it equals 1020. When the substrate is leveled in the vacuum chuck, the substrate 38 is biased against the outer reference surface 1010. This positioning can be repeatably performed between successive substrates. In FIG. 12, where the substrate is chucked and the inner reference surfaces 1018 are still spaced from the substrate, they will only contact the substrate if the substrate is bowed, which may damage a substrate. Thus, the vertical dimension between the inner reference surface 1008 and the outer reference surface 1010 can be selected to limit bowing. Alternatively, in the FIG. 12 embodiment, the inner positioning mounts 1004 can be eliminated.

FIG. 13 shows a vacuum chucked substrate where the inner reference surface 1008 extends further from the end effector 44 than the outer reference surface 1010. A substrate being chucked will be supported by the inner reference surface 1008 before it is supported by the outer reference surface 1010. When the substrate is positioned on the end effector, the spaces 1012 between the inner reference surfaces 1008 maintain a fluid communication between the vacuum pump 422 and volume 1018 defined between the flexible suction cup 1002 and a substrate 38. The outer reference surface 1010 limits the warping and the amount of tilt that can occur between the vacuum chuck and an engaged substrate. If there is a vacuum failure, the wafer will tilt and rest on the outer reference surface 1010 without the substrate falling from the end effector when the wafer is in a face-up position. In the FIG. 13 embodiment, the outer positioning mound can be eliminated while still allowing vacuum chucking of the substrate.

III. Operation

One representative example of operation of a transfer robot 22 comprising end effectors having a vacuum chamber as described above is now described.

In cluster tool 10, the factory interface transport robot 32 transports substrates 38 contained in the cassettes 30 (stored in a face-up position) into the electroplating segment 11. The substrate orienter 34 positions each substrate 38 in an orientation to ensure that the substrate 38 properly aligns with the end effector during processing. The factory interface transfer robot 32 transports substrates 38 between the factory interface 12, the spin-rinse-dry (SRD) station 16, and the thermal anneal chamber 14 as desired.

After the factory interface transfer robot 32 inserts the substrate 38 face-up into the SRD chamber 16, the transfer robot 22 picks up substrate 38 using end effector 44 (by vacuum chucking the substrate to the end effector) in a face-up position. The transfer robot 22 transfers the substrate 38 to a position in the mainframe 18. The inversion mechanism 40 of the end effector 44 then flips or inverts the substrate 38 into the face-down position. The robot arm 42 then inserts the substrate 38 face-down into the plating cell 26. The vacuum chuck of the end effector 44 is then dechucked from substrate 38, and the robot removes the end effector from the plating cell 26 while the substrate remains in the plating cell. Substrate 38 is then processed within the plating cell 26.

After processing, the transfer robot 22 re-enters the plating cell 26 and chucks the substrate 38, and removes the substrate from the plating cell. The transfer robot 22 then transfers substrate 38 from the plating chamber 24 to the mainframe 18. The end effector 44 then flips substrate into a face-up position and transfers the substrate 38 for further face-up processing (if necessary). The transfer robot 22 then transfers substrate 38 into the SRD chamber 16. The factory interface transfer robot 32 then transfers substrate 38 into thermal anneal chamber 14 into the factory interface 12 and onto further processing if necessary. The order and type of substrate processing is dependent upon the processing to be performed.

While foregoing is directed to the preferred embodiment of the present invention, other and further embodiments of the invention may be devised without departing from the basic scope thereof, and the scope thereof is determined by the claims that follow.

What is claimed is:

1. A vacuum chuck for supporting a substrate on a robot blade, the vacuum chuck comprising:

a position reference structure mounted to a surface of the robot blade, the position reference structure comprising an inner reference surface and an outer reference surface, wherein the inner reference surface is defined by a first plurality of positioning mounts and the outer reference surface is defined by a second plurality of positioning mounts; and a suction cup located within a recess in the position reference structure and including a suction mount, wherein the inner reference surface is within the periphery of the suction cup and the outer reference surface is outside of the periphery of the suction cup.

2. The vacuum chuck of claim 1, further comprising a vacuum port coupled to an interior portion of the suction cup.

3. The vacuum chuck of claim 1, wherein the suction cup is deformable between a first state and a second state.

4. The vacuum chuck of claim 3, wherein when the suction cup is in the first state, the suction mount is spaced from the robot blade by a first distance that exceeds the distance that the reference surface is spaced from the robot blade.

5. The vacuum chuck of claim 3, wherein when the suction mount is in the second state, the suction mount is spaced from the robot blade by a second distance that substantially equals the distance that the inner reference surface is spaced from the robot blade.

6. The vacuum chuck of claim 3, wherein when the suction mount is in the second state, the suction mount is spaced from the robot blade by a second distance that substantially equals the distance that the outer reference surface is spaced from the robot blade.

7. The vacuum chuck of claim 1, wherein the position reference structure is hard.

8. The vacuum chuck of claim 1, wherein the suction cup is flexible.

9. The vacuum chuck of claim 1, wherein the suction cup is hard.

10. The vacuum chuck of claim 1, wherein the suction cup enables the vacuum chuck to pick up non-leveled wafers.

* * * * *

UNITED STATES PATENT AND TRADEMARK OFFICE
CERTIFICATE OF CORRECTION

PATENT NO.   : 6,517,130 B1
DATED        : February 11, 2003
INVENTOR(S)  : Donoso et al.

It is certified that error appears in the above-identified patent and that said Letters Patent is hereby corrected as shown below:

Column 1,
Line 51, please change "modem" to -- modern --.

Column 11,
Line 39, please change "mound" to -- mount --.

Signed and Sealed this

Eleventh Day of November, 2003

JAMES E. ROGAN
*Director of the United States Patent and Trademark Office*